US012533818B2

(12) United States Patent
Cheliboni et al.

(10) Patent No.: US 12,533,818 B2
(45) Date of Patent: Jan. 27, 2026

(54) PICK-UP CHUCK WITH GAS BEARING STRUCTURE

(71) Applicant: ASMPT SINGAPORE PTE. LTD., Singapore (SG)

(72) Inventors: Suribabu Cheliboni, Singapore (SG); Ka Shing Kwan, Singapore (SG); Naveen Kumar Gupta, Singapore (SG)

(73) Assignee: ASMPT SINGAPORE PTE. LTD., Singapore (SG)

( * ) Notice: Subject to any disclaimer, the term of this patent is extended or adjusted under 35 U.S.C. 154(b) by 962 days.

(21) Appl. No.: 17/717,199

(22) Filed: Apr. 11, 2022

(65) Prior Publication Data

US 2023/0321843 A1 Oct. 12, 2023

(51) Int. Cl.
*B25J 15/06* (2006.01)
*F16C 32/06* (2006.01)

(52) U.S. Cl.
CPC ........... *B25J 15/0616* (2013.01); *F16C 32/06* (2013.01)

(58) Field of Classification Search
CPC ... F16C 32/06; F16C 32/0622; B25J 15/0616; H01L 21/6838
See application file for complete search history.

(56) References Cited

U.S. PATENT DOCUMENTS

| 5,067,762 A * | 11/1991 | Akashi | B25J 15/0616 271/97 |
| 6,664,549 B2 * | 12/2003 | Kobayashi | H01L 21/6835 355/72 |
| 7,543,867 B2 * | 6/2009 | Pun | B65G 49/065 279/3 |
| 2008/0229811 A1 * | 9/2008 | Zhao | F16C 32/0603 73/104 |
| 2011/0042874 A1 * | 2/2011 | Aoki | G03F 7/70791 29/559 |
| 2013/0009415 A1 * | 1/2013 | Goodman | H01L 21/68785 294/183 |
| 2016/0237565 A1 * | 8/2016 | Sieber | C23C 16/45508 |

* cited by examiner

*Primary Examiner* — Nathaniel E Wiehe
*Assistant Examiner* — Aye S Htay
(74) *Attorney, Agent, or Firm* — OSTROLENK FABER LLP

(57) ABSTRACT

A pick-up chuck for handling a substrate has a chuck body defining a support surface, a gas relay aperture for transmitting a gas, a vacuum aperture portion configured in use to generate a vacuum force to pick up the substrate, and a flow of said gas through the gas relay aperture onto the said support surface towards the vacuum aperture portion. A gas bearing structure arranged on said support surface is shaped to provide a gas bearing between the substrate and said support surface by utilizing the flow of said gas between the gas relay aperture and the vacuum aperture portion.

18 Claims, 4 Drawing Sheets

PICK-UP CHUCK WITH GAS BEARING STRUCTURE

FIELD OF THE INVENTION

The invention relates to a pick-up chuck for handling a substrate and a method for handling such a substrate.

BACKGROUND

The processing of flat objects which might be prone to warping, such as substrates, substrates holding chips and silicon wafers when performing, for example, electrochemical deposition or other processes, typically require the pick up and transfer of those objects. In particular, non-contact (except at non-operational edges in inactive areas of the objects) pick up, transfer and placement of objects using a pick-up chuck may be required while ensuring that the surface of the object is maintained with a minimum number of contamination particles (typically equivalent to Cleanroom Class 1 to Class 100 specifications) in the active portions of the objects and while keeping any warp or deflection of the substrate to within specified standards.

Contamination can have a negative impact on product quality since the performance of a substrate and its quality is very susceptible to damage when there is direct physical contact during manufacture. It is important, particularly in Cleanroom applications, to use a non-contact approach to avoid particle generation and contamination. The non-contact handling of substrates has several advantages including avoiding contamination from contact or rubbing and reducing the danger of mechanical damage. Contamination, as well as any hairline cracks or fractures caused by excessive warping or bending, can have a negative impact on product quality and performance, particularly in the semiconductor industry. Electrostatic discharge, which is also a serious issue for silicon wafers, is reduced by using a non-contact approach for handling substrates. In wafer handling and processing, maintaining flatness is also important for product quality and manufacturing products having no defects. However, some problems may be encountered when providing a pick-up chuck for handling substrates, such as excessive warpage or deflection.

It will be beneficial to provide an improved pick-up chuck for handling a substrate as compared to the prior art.

SUMMARY OF THE INVENTION

Thus, it is an object of the invention to seek to provide a pick-up chuck for handling a substrate which overcomes at least some of the problems of the prior art.

According to a first aspect of the present invention, there is provided a pick-up chuck for handling a substrate, comprising: a chuck body defining a support surface, a gas relay aperture for transmitting a gas, a vacuum aperture portion configured in use to generate a vacuum force to pick up the substrate, and a flow of the gas through the gas relay aperture onto the support surface towards the vacuum aperture portion, and a gas bearing structure arranged on the support surface and shaped to provide a gas bearing between the substrate and the support surface utilizing the flow of the gas between the gas relay aperture and the vacuum aperture portion. The first aspect recognizes that a problem with some existing arrangements is that they typically rely on high gas flow rates to generate the requisite lifting force for the substrate, which makes it difficult to maintain the required position and flatness and which can lead to particle contamination from particles that can be inadvertently introduced from relying on a separate gas supply in order to generate such high gas flow rates.

Accordingly, a pick-up chuck is provided. The pick-up chuck may be utilized for handling a substrate. The pick-up chuck may comprise a chuck body. The chuck body may define a support surface. The chuck body may define a gas relay aperture for transmitting or conveying a gas. The chuck body may define a vacuum aperture portion. The vacuum aperture portion may be configured in use to generate a vacuum force to pick up or lift the substrate. The vacuum aperture portion may be configured in use to generate a flow of the gas through the gas relay aperture onto the support surface towards the vacuum aperture portion. The chuck body may define a gas bearing structure arranged on the support surface. The gas bearing structure may be shaped to provide a gas bearing between the substrate and the support surface, utilizing the flow of the gas between the gas relay aperture and the vacuum aperture portion. In this way, the gas flow towards the vacuum aperture portion, which passes over the gas bearing structure, creates a gas bearing effect between the support surface and the substrate as the gas flows over the gas bearing structure. The force generated on the substrate by the gas bearing structure opposes the force generated on the substrate by the vacuum aperture portion, which helps to reduce the amount of warpage or deflection experienced by the substrate and further helps to keep that warpage or deflection to within a specified amount. Also, adequate lifting forces can be achieved with very low vacuum flow rates, which avoids the need for a separate gas supply, and therefore minimizes the risks of particle contamination.

The gas bearing structure may protrude, upstand or extend from the support surface.

The gas bearing structure may define at least one of a planar and a curved leading edge facing towards the gas relay aperture.

The gas bearing structure may define at least one of a planar and a curved trailing edge facing towards the vacuum aperture portion.

The gas bearing structure may define a flat gas bearing surface extending between the leading edge and the trailing edge. The shape and configuration of the gas bearing structure is typically selected to provide the required amount of force generated by the bearing effect of the gas bearing structure to ensure that the warpage or deflection of the substrate is maintained within acceptable limits.

The trailing edge may be positioned proximate or adjacent the vacuum aperture portion.

The gas bearing structure may be configured in use to space the substrate away from the support surface. The substrate may be spaced away from the support surface due to the gas bearing force generated by the gas bearing structure.

The gas relay aperture may be configured to supply the gas to flow over the support surface.

The gas relay aperture may be defined by an inner or central region or area of the chuck body. The inner region may be at least partially surrounded by the gas bearing structure.

The gas relay aperture and the gas bearing structure may be separated or spaced apart by an inner support surface region or area extending between the gas relay aperture and the gas bearing structure. The gas bearing structure may be raised, protrude, upstand or extend with respect to the inner support surface region.

The gas bearing structure may be at least partially surrounded by the vacuum aperture portion.

The gas bearing structure may comprise an annular structure and the vacuum aperture portion may include a plurality of vacuum holes distributed along an annular section of the chuck body.

The chuck body may define a substrate support shaped to protrude, upstand or extend from the support surface and at least partially surround the vacuum aperture portion.

The substrate support may be shaped and positioned to contact a non-operational or inactive area along a periphery or edge of the substrate.

The substrate support may comprise an annular structure.

The substrate support may be dimensioned to protrude, upstand or extend from the support surface by a distance greater than the gas bearing structure.

The gas relay aperture may comprise a flow restrictor configured to limit a flow of the gas.

The flow restrictor may comprise a porous material through which the gas is permeable.

The pick-up chuck may further comprise a pump coupled with the vacuum aperture portion. The pump may be configured to draw the gas through the gas relay aperture, across the support surface, over the gas bearing structure and through the vacuum aperture portion.

The gas relay may be in fluid communication with ambient air.

According to a second aspect of the present invention, there is provided a method for handling a substrate, comprising: providing a pick-up chuck for handling a substrate comprising a chuck body defining a support surface, a gas relay aperture, a vacuum aperture portion and a gas bearing structure arranged on the support surface and shaped to provide a gas bearing between the substrate and the support surface; generating a vacuum force using the vacuum aperture portion to draw a gas through the gas relay aperture, onto the support surface towards the vacuum aperture portion and over the gas bearing structure to provide the gas bearing between the substrate and the support surface; and picking up the substrate.

The method may have steps corresponding to the features of the first aspect set out above.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION

Before discussing embodiments in any more detail, first an overview will be provided. Some embodiments provide a pick-up chuck for handling a substrate. The pick-up chuck has a vacuum aperture portion which draws gas from a gas relay aperture and over a support surface having a gas bearing structure. The flow of gas over the gas bearing structure causes a gas bearing effect which generates an opposing bearing force which helps to counter or ameliorate the vacuum force exerted on the substrate by the vacuum to prevent excessive warpage or deflection of the substrate caused by the pick-up chuck. The shape, configuration and location of the gas bearing structure is selected to suit the operation of the pick-up chuck and the particular substrate intended to be handled. In some embodiments, the gas relay aperture controls or restricts the amount of gas flowing over the support surface in response to the vacuum generated by the vacuum aperture portion which enables the pick-up chuck to be operated with reduced vacuum flow rates. In turn, this avoids the need for a separate gas supply to be provided and enables ambient gas (in particular atmospheric air) already in the vicinity of the pick-up chuck to be used by the pick-up chuck, which minimizes the risk of particle contamination since ambient gas present in the environment that the processing apparatus is located already meets particle concentration standards. In some embodiments, the vacuum force and bearing force are balanced to achieve complete non-contact between the pick-up chuck and the substrate. In some embodiments, the pick-up chuck is provided with a substrate support which receives typically an inactive (often peripheral) portion of the substrate, which helps to maintain the vacuum force and direct the gas flow into the vacuum aperture portion from over the support surface and gas bearing.

Pick-Up Chuck

Figure 1:
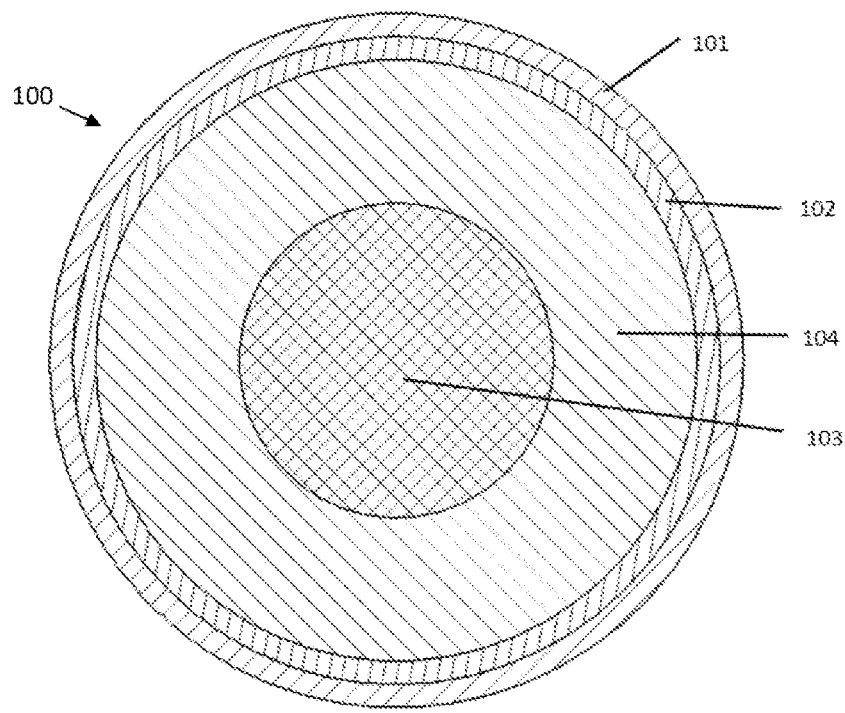
FIG. 1 is a schematic view of a pick-up chuck, showing the pick-up chuck's zones in accordance with an embodiment of the present invention.

FIG. 1 illustrates schematically a pick-up chuck 100 according to one embodiment of the present invention. In this embodiment the pick-up chuck 100 is configured to pick up generally circular substrates such as semiconductor wafers and so has a generally circular configuration. However, the general configuration of the pick-up chuck 100 can be altered to suit picking up substrates of different shapes.

The pick-up chuck 100 has a support surface which defines a number of different zones. A gas bearing zone 102 is created near the outer region of the substrate. A vacuum zone 101 is created near the edge region of the substrate and a gas relay zone 103 is provided in a central region of the substrate. Accordingly, the pick-up chuck 100 has a gas relay zone 103, an inner support surface zone 104 surrounding the gas relay zone 103, a gas bearing zone 102 surrounding the inner support surface zone 104 and a vacuum zone 101 surrounding the gas bearing zone 102. The shape, configuration, area and/or width of these zones can be chosen depending on the type of substrate to be handled, the method used and the level of precision required. The gas flow between the support surface and the substrate is typically controlled by a membrane or the like with an appropriate pore size within the gas relay zone 103. The support surface is shaped to provide a gas bearing effect which generates a bearing force between the pick-up chuck 100 and the substrate to oppose a vacuum force generated by the vacuum zone 101. The gas bearing zone 102 and the controlled gas flow provide the necessary lift and balance force to maintain flatness of the substrate to enable the substrate to be handled without contact. A vacuum line or inlet coupled with the vacuum zone 101, together with a protrusion of desired shape in the gas bearing zone 102 facing the substrate, creates the gas bearing effect between the support surface and the substrate. The gas bearing effect is controlled by both the vacuum supply and the membrane having a desired pore size located in the gas relay zone 103. The configuration of the support surface as well as the depth and width of the profile of the gas bearing zone 102 influence the gas bearing effect. The vacuum flow rate and the membrane pore size are chosen based on the lift force necessary, the flatness requirements for the substrate and the desired gas bearing effect for the pick-up, transfer and placement of the substrate.

Hence, in some embodiments, the design of the pick-up chuck 100 is like a chamber which creates three circular, annular, rectangular and/or polygon zones. Typically, the innermost gas relay zone 103 is open to an ambient gas and covered by a membrane such as filter paper and/or cloth material having a desired pore size. The membrane is maintained at atmospheric pressure and the membrane helps to modulate or control a gas flow rate through the membrane. The gas bearing zone 102 is typically provided by a small protrusion of a desired shape and size to create a gas bearing effect between the pick-up chuck 100 and the substrate. The vacuum zone 101 is typically created by creating one or more vacuum passages in the pick-up chuck 100 and connecting these vacuum passages to vacuum inlets. Hence, the operation of a low vacuum supply can be used to create the gas bearing effect in combination with the membrane which restricts the gas flow. Once a substrate is placed near the pick-up chuck 100 at the required position or location, the pick-up chuck 100 creates a lifting force to lift the substrate towards the pick-up chuck 100 while the gas bearing zone 102 creates a gas bearing between the pick-up chuck 100 and the substrate in order to prevent unnecessary flexing of the substrate and to prevent typically the active part of the substrate from contacting with the pick-up chuck 100.

Figure 2:
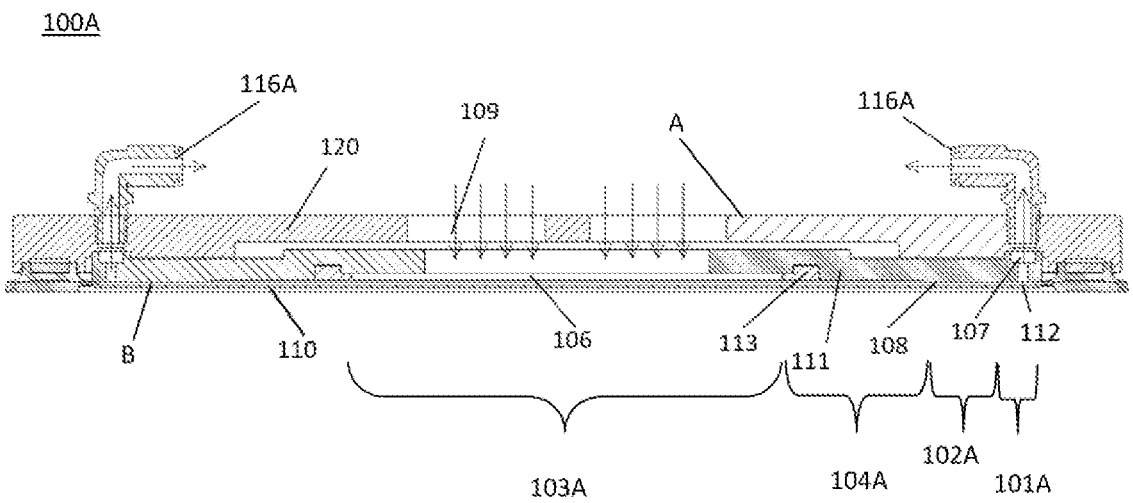
FIG. 2 is a cross-sectional view of the pick-up chuck of FIG. 1 showing its fluid flow directions.
Figure 3:
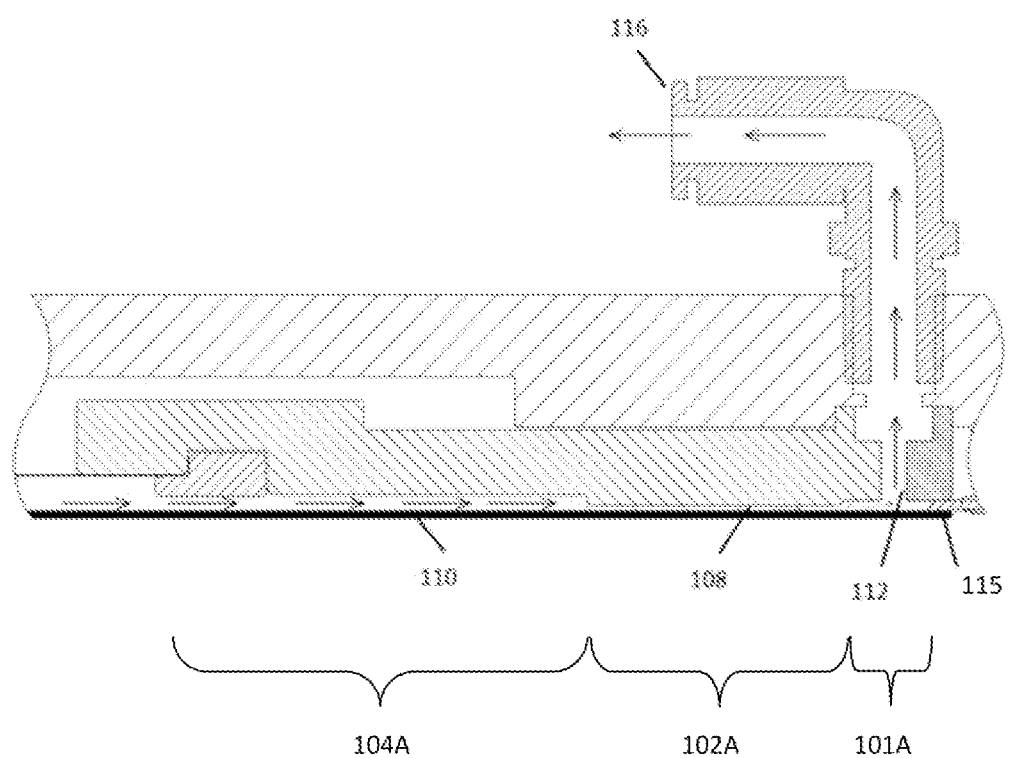
FIG. 3 is an enlarged cross-sectional view of the pick-up chuck of FIG. 1.
Figure 4:
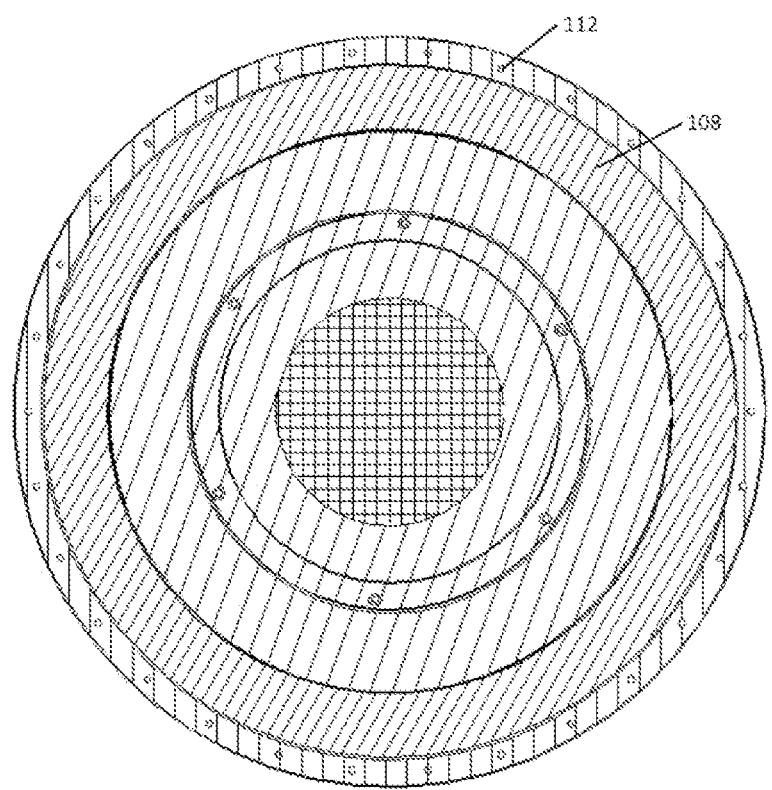
FIG. 4 is a plan view of a substrate pick-up side of the pick-up chuck in accordance with an embodiment of the present invention.

FIGS. 2 to 4 illustrate a pick-up chuck 100A, according to one embodiment. This arrangement provides for non-contact of an object (except for contact at edges of the object, such as a substrate to be picked up, transferred and released) while maintaining the object surface with a minimum number of contamination particles (typically equivalent to Cleanroom class 1 to class 100 specifications on the active side and in the active area of the substrate) while maintaining the object within specified warpage or deflection standards.

A vacuum flow inlet 116A connects to a vacuum channel 107 which couples with distributed vacuum holes 112 included within a vacuum aperture portion creating a vacuum zone 101A in a chuck outer edge region. The vacuum holes 112 are typically uniformly distributed (see FIG. 4) and are open on the surface of the pick-up chuck 100A facing a substrate 110. The pick-up chuck 100A has a rectangular or rounded protrusion which forms a gas bearing structure 108. The shape of the gas bearing structure 108 is determined by the required application and the substrate 110 to be manipulated. Typically, the gap between the gas bearing structure 108 and the substrate 110 is minimal, ranging from around 50 to 1000 microns. The gas bearing structure 108 generates a gas bearing zone 102A between the substrate 110 and the pick-up chuck 100A. A porous membrane 106 defines a gas relay zone 103A. The pore size of the membrane 106 is selected based on application requirements. The pore size of the membrane 106 controls the flow of gas from a reverse side A of the pick-up chuck 100A to a support surface B of the pick-up chuck 100A facing the substrate 110. The region between the gas relay zone 103A and the gas bearing zone 102A defines an inner support surface zone 104A.

In operation, a vacuum is applied to the vacuum flow inlets 116A which causes a gas flow through the vacuum holes 112 into the vacuum channel 107. That vacuum flow causes a lifting effect on the substrate 110 as the pick-up chuck 100A approaches the substrate 110. As the substrate approaches the pick-up chuck 100A, this defines a region between the support surface B and the substrate 110. The flow of gas into this region is then controlled by the pore size of the membrane 106. The gas is provided by the ambient gas within a Cleanroom environment where a semiconductor processing apparatus and the pick-up chuck 100A thereof are located and is provided at ambient (typically atmospheric) pressure within the semiconductor processing apparatus, passes through the membrane 106 and flows through the region between the support surface B and the substrate 110 where it flows out through the vacuum flow inlets 116A. This gas flow creates a lifting force for the substrate 110 to be picked up in a non-contact manner. The lifting force is enough to carry the substrate 110 with high precision whilst maintaining a required degree of flatness. To avoid unwanted physical contact, the vacuum force produced by the vacuum zone 101A keeps the substrate 100 near to the support surface B, while the gas bearing zone 102A created by the gas bearing structure 108 creates a gas bearing effect force which maintains separation of the substrate 110 from the support surface B of the pick-up chuck 100A. The balance of these forces allows the substrate 110 to be handled with high precision without the risk of touching its active or operational zone. Particle contamination of the substrate 110 is unlikely because there is no external fluid supply or no compressed dried air supply used and because there is a relatively low vacuum pressure gas flow.

In some embodiments, components of the pick-up chuck 101A are made of metal, ceramic, plastic and/or carbon materials. The pick-up chuck 101A can be a solid, rigid body or an assembly of sub-parts which together provide the required shape and features. The material of the pick-up chuck 101A can be metallic, ceramic, plastic or carbon material and/or combinations thereof. The membrane 106 can typically be a filter paper, cloth, porous material and/or a wire mesh having a specified pore size to suit the intended process or application requirements. Accordingly, the membrane 106 may be made of nylon, hydrophobic, hydrophilic, PVDF, MCE(CA-CN), CA, PTFE, PES, PP, string-wound glass filter, and/or a glass fiber material.

The widths shown for the zones are for illustration purposes only and are typically selected based on the required application or process to be performed. The membrane 106 can be bonded onto the pick-up chuck 100A or sandwiched utilizing mounting components 113. Although the membrane 106 is open to gas 109 at atmospheric pressure within the processing apparatus, it will be appreciated that this need not be the case and that the membrane 106 can be connected to an enclosed chamber of any gas maintained at a desired pressure. The pick-up chuck 100A can be formed from a top plate 120 as well as a bottom plate 111. However, in other embodiments a single unitary body may be provided to form the required shape.

As shown in more detail in FIG. 3, which shows the pick-up chuck 100A in pick-up mode, the substrate 110 is held in place without the operational or active zone of the substrate 110 touching the pick-up chuck 100A (except for peripheral contact at the non-operational or inactive edges of the substrate on a substrate support annular ring 115). The gas bearing structure 108 can be formed of different shapes or using multiple profiles dependent on the amount of fluid bearing force required, depending on the intended application or process. The shape of the gas bearing structure 108 can be rectangular, tapered and/or rounded or a combination of these in order to generate the required fluid bearing force.

As can be seen in FIG. 4, the vacuum holes 112 in this embodiment are uniformly distributed around the circumference of the pick-up chuck 100A, within the vacuum zone 101 or vacuum aperture portion. However, the size, number and distribution of the vacuum holes 112 are selected based on the intended application or process in order to generate the required amount of vacuum force on the substrate 110.

Figure 5:
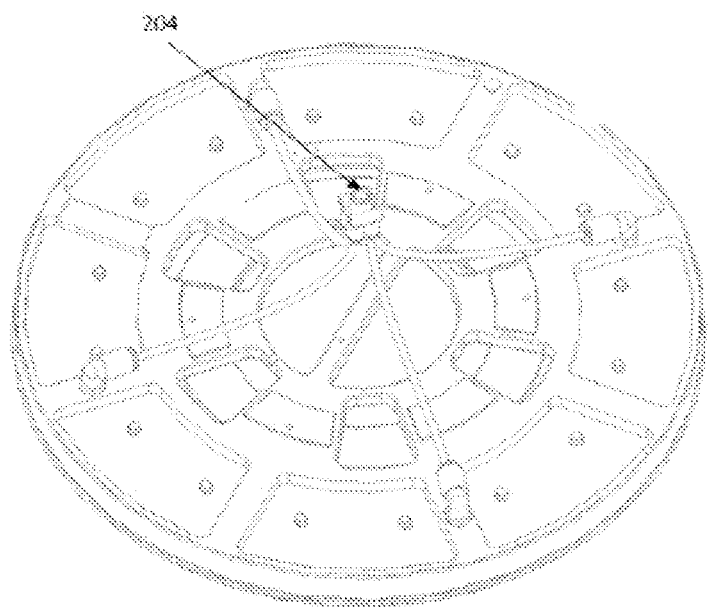
FIG. 5 is an isometric view of a side of the pick-up chuck opposite to the substrate pick-up side in accordance with an embodiment of the present invention.

As can be seen in FIG. 5, the number of vacuum inlets 116 are coupled to a vacuum inlet connector 204. The number of vacuum inlets 116 is not limited to 4 but can be fewer or more as per the application requirements. The type of vacuum inlet connector 204 is also not limited to an angled connector as shown, and it can be straight, U-shaped, T-shaped or a direct connection.

Figure 6:
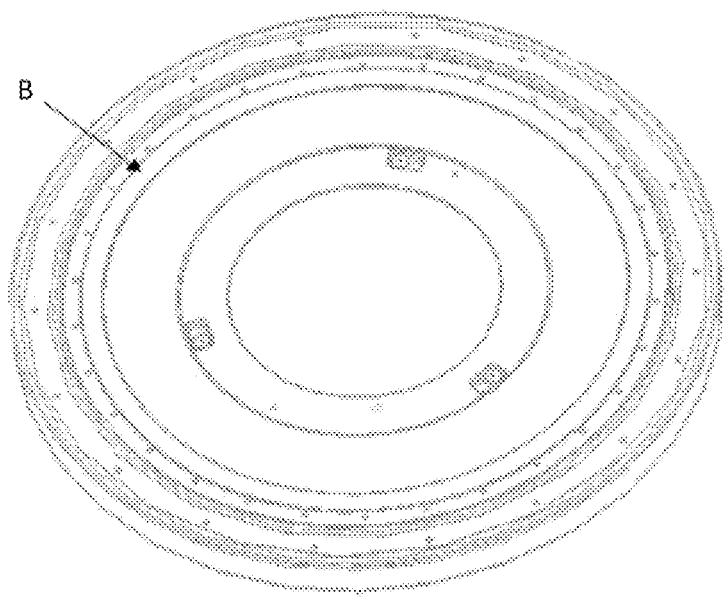
FIG. 6 is an isometric view of the pick-up chuck in accordance with an embodiment of the present invention, showing the pick-up chuck from the substrate pick-up side.

FIG. 6 shows an isometric view of the pick-up chuck in accordance with an embodiment of the present invention, showing the pick-up chuck from the substrate pick-up side.

Although the present invention has been described in considerable detail with reference to certain embodiments, other embodiments are possible.

Therefore, the spirit and scope of the appended claims should not be limited to the description of the embodiments contained herein.

The invention claimed is:

1. A pick-up chuck for handling a substrate, comprising a chuck body defining:
   a support surface;
   a gas relay aperture for transmitting a gas, the gas relay aperture being located at a central region of the chuck body and surrounded by the support surface;
   a vacuum aperture portion at least partially surrounding the support surface configured in use to generate a vacuum force to pick up the substrate, and a flow of the gas through the gas relay aperture onto the support surface towards the vacuum aperture portion; and
   a gas bearing structure located between the gas relay aperture and the vacuum aperture portion arranged on the support surface and shaped to provide a gas bearing between the substrate and the support surface utilizing the flow of the gas from the gas relay aperture to the vacuum aperture portion.

2. The pick-up chuck of claim 1, wherein the gas bearing structure protrudes from the support surface and defines at least one of a planar and curved leading edge facing towards the gas relay aperture.

3. The pick-up chuck of claim 2, wherein the gas bearing structure defines at least one of a planar and curved trailing edge facing towards the vacuum aperture portion.

4. The pick-up chuck of claim 3, wherein the gas bearing structure defines a flat gas bearing surface extending between the leading edge and the trailing edge.

5. The pick-up chuck of claim 3, wherein the trailing edge is positioned proximate the vacuum aperture portion.

6. The pick-up chuck of claim 1, wherein the gas bearing structure is configured in use to space the substrate away from the support surface.

7. The pick-up chuck of claim 1, wherein the gas relay aperture is configured to supply the gas to flow over the support surface.

8. The pick-up chuck of claim 1, wherein the gas relay aperture and the gas bearing structure are separated by an inner support surface region extending between the gas relay aperture and the gas bearing structure, the gas bearing structure being raised with respect to the inner support surface region.

9. The pick-up chuck of claim 1, wherein the gas bearing structure comprises an annular structure and the vacuum aperture portion includes a plurality of vacuum holes distributed along an annular section of the chuck body.

10. The pick-up chuck of claim 1, wherein the chuck body defines a substrate support shaped to protrude from the support surface and at least partially surrounding the vacuum aperture portion.

11. The pick-up chuck of claim 10, wherein the substrate support is shaped and positioned to contact a non-operational area along a periphery of the substrate.

12. The pick-up chuck of claim 11, wherein the substrate support comprises an annular structure.

13. The pick-up chuck of claim 11, wherein the substrate support is dimensioned to protrude from the support surface by a distance greater than the gas bearing structure.

14. The pick-up chuck of claim 1, wherein the gas relay aperture comprises a flow restrictor configured to limit the flow of the gas.

15. The pick-up chuck of claim 14, wherein the flow restrictor comprises a porous material through which the gas is permeable.

16. The pick-up chuck of claim 1, further comprising a pump coupled with the vacuum aperture portion and configured to draw the gas through the gas relay aperture, across the support surface, over the gas bearing surface and through the vacuum aperture portion.

17. The pick-up chuck of claim 1, wherein the gas relay aperture is in fluid communication with ambient air.

18. A method for handling a substrate comprising:
   providing a pick-up chuck for handling a substrate comprising a chuck body defining a support surface, a gas relay aperture located at a central region of the chuck body and surrounded by the support surface, a vacuum aperture portion at least partially surrounding the support surface, and a gas bearing structure located between the gas relay aperture and the vacuum aperture portion arranged on the support surface and shaped to provide a gas bearing between the substrate and the support surface;
   generating a vacuum force using the vacuum aperture portion to draw a gas through the gas relay aperture, onto the support surface from the gas relay aperture to the vacuum aperture portion which flows over the gas bearing structure to provide the gas bearing between the substrate and the support surface; and
   picking up the substrate.

* * * * *